United States Patent [19]

Hirsch et al.

[11] Patent Number: 4,897,601
[45] Date of Patent: Jan. 30, 1990

[54] TEST FIXTURE FOR INTEGRATED CIRCUIT CHIPS

[75] Inventors: Vincent A. Hirsch; Edward D. Freymiller; Edward C. Johnson, all of Boulder, Colo.

[73] Assignee: Ball Corporation, Munice, Ind.

[21] Appl. No.: 162,786

[22] Filed: Mar. 2, 1988

[51] Int. Cl.⁴ .......................... G01R 31/02; G01R 1/06
[52] U.S. Cl. .................................. 324/158 F; 333/246
[58] Field of Search ........... 324/158 F, 158 P, 73 PC, 324/72.5; 333/246; 439/71, 73, 331

[56] References Cited

U.S. PATENT DOCUMENTS

| | | | |
|---|---|---|---|
| 3,651,434 | 3/1972 | McGeough et al. | 333/247 X |
| 3,775,644 | 11/1973 | Cotner et al. | 333/246 X |
| 4,365,195 | 12/1982 | Stegens | 333/246 X |
| 4,480,240 | 10/1984 | Gould | 333/246 X |
| 4,567,432 | 1/1986 | Buol et al. | 324/158 R |
| 4,574,235 | 3/1986 | Kelly et al. | 324/158 P |
| 4,630,875 | 12/1986 | Korsunsky et al | 439/73 X |
| 4,689,556 | 8/1987 | Cedrone | 324/158 E X |
| 4,747,784 | 5/1988 | Cedrone | 324/158 F X |
| 4,758,176 | 7/1988 | Abe et al. | 439/73 X |

*Primary Examiner*—Reinhard J. Eisenzopf
*Assistant Examiner*—Vinh P. Nguyen
*Attorney, Agent, or Firm*—Gilbert E. Alberding

[57] ABSTRACT

Apparatus and method are provided for making rf contact between the ground plane surface of a microwave-monolithic-integrated-circuit chip and a test fixture. The test fixture includes a chip support with a planar surface, a chip stop with a wedging surface, a clamp-release lever with a wedging surface, and a spring. The conductive ground plane surface of a MMIC chip is pressed against a planar surface with a contacting force that is a function of a clamping force that is applied to one of the wedging surfaces, and that is a function of angles of the wedging surfaces. Heat applied to the MMIC chip cooperates with the contacting force to provide a suitable rf connection between the ground plane surface of the chip and the planar surface of the test fixture.

9 Claims, 2 Drawing Sheets

TEST FIXTURE FOR INTEGRATED CIRCUIT CHIPS

BACKGROUND OF THE INVENTION

1. Field of the Invention

The present invention relates to test fixtures for testing integrated circuit chips. More particularly, the present invention relates to a test fixture and a method for non-destructive testing of microwave-monolithic-integrated-circuit chips.

2. Description of the Related Art

Commonly, testing of microwave-monolithic-integrated-circuit chips has included soldering the chip to a conductive metal surface to provide a ground plane, and soldering wires or ribbons to bias and rf contacts on the chip.

Unfortunately, if the MMIC chip which is tested is found to be a satisfactorily working device, it is difficult, and sometimes impossible, to remove the chip from the ground plane without destroying it.

Stegens, in U.S. Pat. No. 4,365,195, discloses a device for testing coplanar waveguide microwave integrated circuit chips. The device of Stegens provides a manually actuated screw which is used to adjustably force the chips into contact coaxial terminals, and also into contact with a resilient conductive material.

The resilient conductive material provides suitable ground contact while allowing the non-deformable coaxial contacts to receive the correct contacting pressure, and thereby provide input and output connections for microwave energy.

SUMMARY OF THE INVENTION

In the present invention, a test fixture is provided in which the conductive ground plane surface of a microwave-monolithic-integrated-circuit chip (MMIC) is placed between two chip stops and onto a planar surface of the test fixture; a clamping force is placed on the edges of the chip by a spring that engages one of the chip stops; and rf grounding contact is made with the planar surface by a predetermined contacting force that results from beveled surfaces, or wedging surfaces, on the chip stops.

The method includes clamping the chip between the chip stops, pressing the chip into grounding contact with the planar surface of the test fixture, making bonded rf and bias connections, testing the chip, removing the bonded connections, and removing the tested chip from the test fixture.

A suitable rf connection is made between the conductive ground plane surface of the chip and the test fixture by the combined effect of the contacting pressure and the heat that is added to the chip while making bonded rf and bias connections.

In a preferred embodiment, one of the chip stops comprises a clamp-release lever that is pivotally mounted to a base of the test fixture; so that the wedging surface of that chip stop moves arcuately toward the other chip stop and toward the planar surface.

It is a primary object of the present invention to provide apparatus and method for non-destructive testing of MMIC chips and other such devices;

It is an object of the present invention to provide suitable ground plane contact with a chip, without the necessity of bonding the chip to a metallic surface;

It is another object of the present invention to provide a test fixture that presses the ground plane surface of a chip against a planar surface of the test fixture with a predetermined force; and It is another object of the present invention to provide a test fixture in which a chip is clamped between two chip stops with a predetermined clamping force, and the predetermined clamping force, together with wedging surfaces on the chip stops, provides a predetermined contacting force between the ground plane surface on the chip and a planar surface on the test fixture.

BEST MODE FOR CARRYING OUT THE INVENTION

Figure 1:
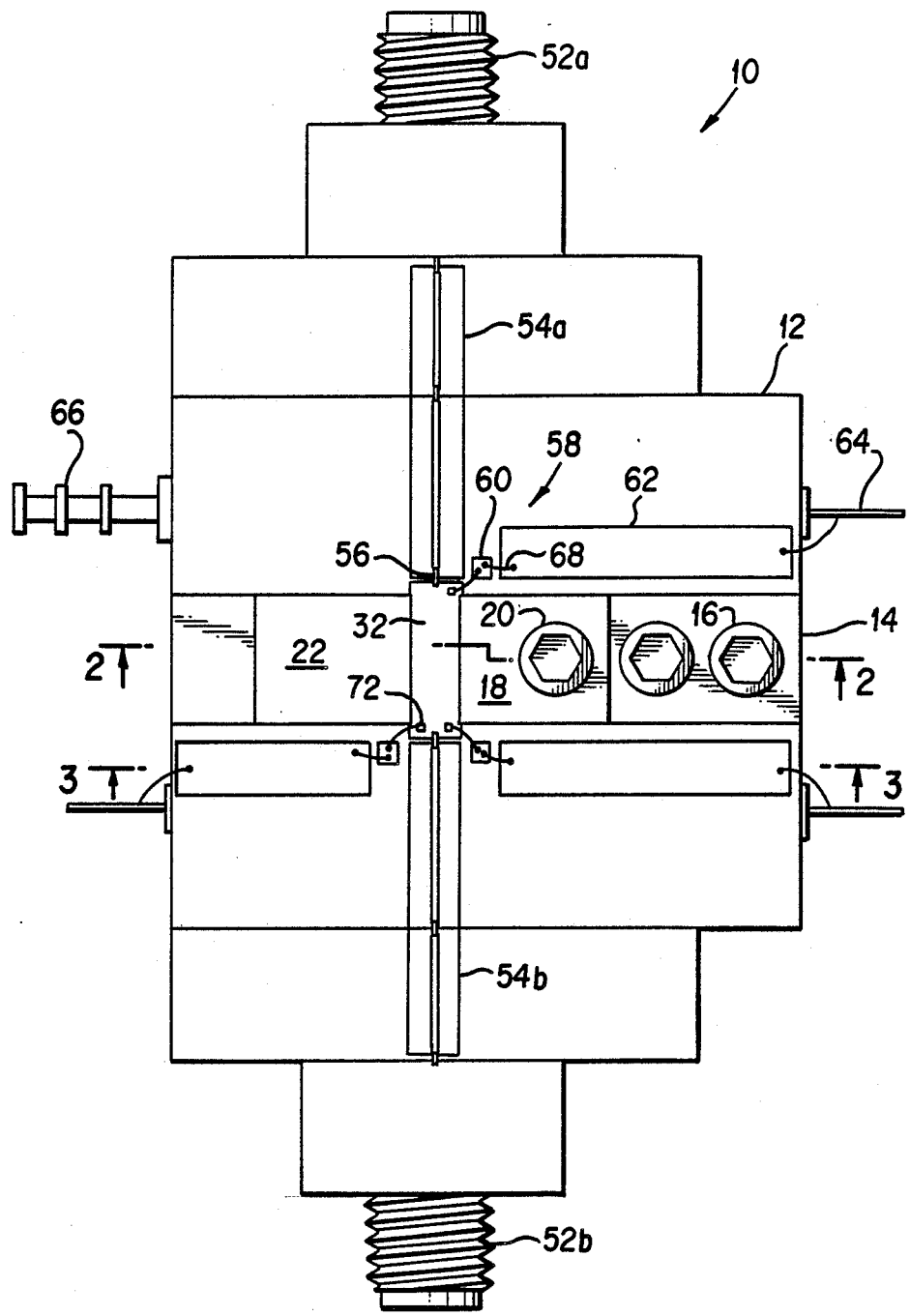
FIG. 1 is a top plan view of the test fixture of the present invention, showing an integrated circuit chip held between the chip stops thereof.
Figure 2:
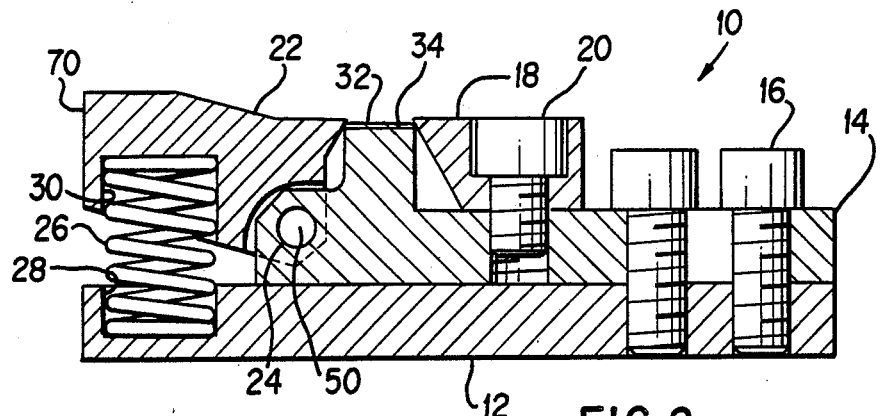
FIG. 2 is a slightly enlarged cross-sectional view, taken substantially as shown by section line 2—2 of FIG. 1.

Referring now to the drawings, and more particularly to FIGS. 1 and 2, a test fixture 10 includes a base 12, a chip support 14 that is secured to the base 12 by cap screws 16, a chip stop, or edge stop, 18 that is secured to the chip support 14 by a cap screw 20, a chip stop, or clamp-release lever 22 that is pivotally attached to the chip support 14 by a pivot pin 24, and a spring 26 that is pocketed in a cavity 28 of the base 12 and in a cavity 30 of the clamp-release lever 22.

Figure 3:
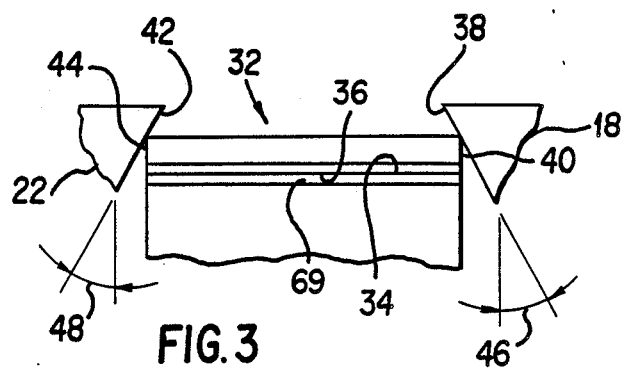
FIG. 3 is a partial and enlarged cross section of FIG. 2, taken substantially as shown by view line 3—3, showing details of the planar surface of the chip support and details of the chip being tested.

Referring now to FIGS. 1-3, and more particularly to FIG. 3, in operation, a MMIC chip 32 is placed onto a generally planar surface 34 of the chip support 14 with a conductive ground plane surface 36 of the chip 32 in contact with the planar surface 34. A wedging surface, or beveled surface, 38 of the chip stop 18 engages an edge 40 of the chip 32; and a wedging surface, or beveled surface, 42 of the clamp-release lever 22 engages an edge 44 of that chip 32 that is spaced-apart from the edge 40.

The spring 26 provides a resilient and predetermined force to the clamp-release lever 22 that forces the wedging surface 42 toward the wedging surface 38 with a predetermined clamping force. This predetermined clamping force, together with an angle 46 of the beveled surface 38 and an angle 48 of the beveled surface 42, provides a predetermined contacting force for pressing the conductive ground plane surface 36 of the chip 32 into rf conducting contact with the planar surface 34 of the chip support 14. Since the predetermined clamping force on the wedging surface 42 provides a predetermined contacting force for pressing the conductive ground plane surface 36 of the chip 32 in rf conducting contact, it can be seen that the present invention provides means for pressing the ground plane surface against the planar surface with a contacting force that is a predetermined ratio of the predetermined clamping force.

The wedging surface 42 moves inwardly toward the wedging surface 38 and downwardly toward the planar surface 34 as the clamp-release lever 22 is pivoted around a pivot axis 50 of the pivot pin 24, and as the wedging surface 38 moves arcuately around the pivot axis 50. Therefore, since the wedging surface 38 remains stationary, whereas the wedging surface 42 moves arcuately, preferably, the angles 46 and 48 are selected to components for the differences in contacting pressures that the stationary wedging surface 38 and the arcuately movable wedging surface 42 apply to the edges 40 and 44 of the chip 32. However, entirely satisfactory results have been achieved with both of the angles, 46 and 48, being thirty degrees.

Referring again to FIG. 1, the test fixture 10 also includes 40 GHz K-connector coaxial-to-microstrip launchers, 52a and 52b which are secured to the base 12. Microstrips 54a are bonded to the launcher 52a and to the chip 32; and microstrips 54b are bonded to the launcher 52b and to the chip 32. Interconnections 56 of the microstrips 54a and 54b, with rf contacts on the MMIC chip are made with gold wire, or gold ribbon.

The test fixture 10 also includes bias circuits 58 to supply dc power to the MMIC chip 32. The bias circuits 58 include bypass capacitors 60, conductive surface 62 that are insulated from ground, bias terminals 64, a ground terminal 66, and wire and/or ribbon interconnects 68.

The chip support is plated with a $100 \times 10^{-6}$ inches layer of nickel followed by a layer 69 of pure gold that is greater than $150 \times 10^{-6}$ inches.

In operation, an end 70 of the clamp-release lever 22 is repressed, moving the wedging surface 42 upwardly and outwardly with respect to the beveled surface 38 and the planar surface 34; a chip 32 is placed onto the planar surface 34; the chip 32 is positioned over the planar surface 34 and is clamped with a predetermined clamping force by the spring 26, the chip stop 18, and the clamp-release lever 22. The wedging surfaces, 38 and 42, cooperate with the predetermined clamping force to press the chip 32 against the chip support 14 with a predetermined contacting force.

The slight downward pressure that is applied to the MMIC chip by the chip stops, 18 and 22, together with the heat that is applied during ribbon or wire bonding of bonded connections 72 to the MMIC chip 32, produces an intimate contact between the conductive ground plane surface 36 which is gold plated, and the planar surface 34 which is also gold plated.

Therefore, the present invention provides non-destructive testing of MMIC chips by providing ground plane contact between the MMIC chip and the test fixture without the necessity of bonding the chip to the test fixture.

Figure 4:
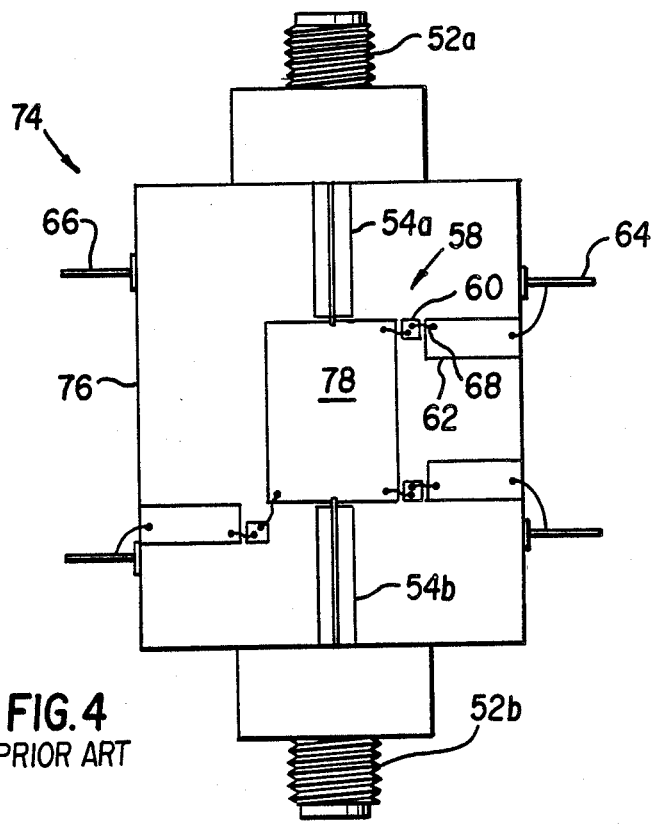
FIG. 4 is a top plan view, taken substantially the same as FIG. 1, of a prior art device for testing of microwave-monolithic-integrated-circuit chips.

Referring now to FIG. 4, a prior art test fixture 74 includes a base 76, the microstrip launchers 52a and 52b, the microstrips 54a and 54b, and the bias circuits 58. The bias circuits 58 include the same components as named and numbered for the embodiment of FIGS. 1-3.

In contrast to the present invention, the prior art device of FIG. 4, and the method thereof, requires soldering a MMIC chip 78 to the base 76, making it impractical, and often impossible, to remove the chip and use it after it had been proved to be a satisfactorily working device.

Therefore, the present invention provides apparatus and method for making rf contact with the ground plane surface 36 of a MMIC chip 32, which is highly superior to the prior art apparatus and method.

While specific apparatus has been disclosed in the preceding description, it should be understood that these specifics have been given for the purpose of disclosing the principles of the present invention and that many variations thereof will become apparent to those who are versed in the art. Therefore, the scope of the present invention is to be determined by the appended claims.

INDUSTRIAL APPLICABILITY

The present invention is applicable to testing, and other non-permanent mounting, of solid-state components of the type having conductive ground plane surfaces. The present invention is particularly applicable to testing microwave-monolithic-integrated-circuit chips.

What is claimed is:

1. A test fixture for non-destructive testing of integrated circuit chips of the type having spaced-apart edges and a ground plane surface that is disposed between said spaced-apart edges, which test fixture comprises:
   a base;
   a chip support being operatively secured to said base, and having a generally planar surface;
   clamping means, comprising first and second chip stops that are operatively attached to said base, for placing a predetermined resilient force on said spaced-apart edges;
   contacting means, comprising first and second wedging surfaces on respective ones of said chip stops, for pressing said ground plane surface against said planar surface with a contacting force that is a predetermined ratio of said predetermined resilient force; and
   releasing means for selectively moving one of said chip stops away from the other of said chip stops.

2. A test fixture as claimed in claim 1 in which said means for moving said one chip stop away from said other chip stop comprises means for arcuately moving said one chip stop.

3. A test fixture as claimed in claim 2 in which said test fixture includes a clamp-release lever that is pivotally attached to said base;
   said clamp-release lever includes said one chip stop;
   said arcuate movement of said one chip stop, comprise a pivotal attachment of said clamp-release lever to said base; and
   said means for placing said predetermined resilient force on said spaced-apart edges comprises a spring that operatively engages said clamp-release lever.

4. A method for non-destructive testing of integrated circuit chips of the type having spaced-apart edges, and having a conductive ground plane surface that is disposed between said spaced-apart edges, which method comprises:
   (a) providing a chip support with a generally planar surface;
   (b) locating a chip with one of the edges thereof against a first chip stop;
   (c) resiliently urging a second chip stop against the other of said edges of said chip with a predetermined clamping force;
   (d) pressing said conductive ground plane surface against said planar surface with a predetermined contacting force that is a predetermined ratio of said clamping force; and
   (e) making bonded electrical connections with said chip.

5. A method as claimed in claim 4 in which said pressing step, and said contacting force thereof, comprises utilizing a predetermined proportion of said predetermined clamping force.

6. A method for non-destructive testing of integrated circuit chips of the type having spaced-apart edges, and having a conductive ground plane surface that is disposed between said spaced-apart edges, which method comprises:
 (a) providing a chip support with a generally planar surface;
 (b) locating a chip with one of the edges thereof against a first wedging surface of a first chip stop;
 (c) clamping said second wedging surface of a second chip stop against the other of said edges of said chip;
 (d) pressing said conductive ground plane surface against said planar surface with a predetermined contacting force;
 (e) making bonded electrical connections with said chip; and
 (f) said clamping step comprises moving said second wedging surface arcuately toward said first wedging surface and toward said planar surface.

7. A method as claimed in claim 6 in which said arcuate moving step comprises pivoting said second chip stop around a pivot axis.

8. A method as claimed in claim 7 in which said pressing with a predetermined contacting force comprises utilizing a spring to resiliently urge said second wedging surface arcuately toward said first wedging surface and said planar surface.

9. A method as claimed in claim 8 in which said method comprises selectively moving said second wedging surface arcuately away from said first wedging surface and away from said planar surface.

* * * * *